United States Patent [19]
Horwitz et al.

[11] Patent Number: 5,103,367
[45] Date of Patent: Apr. 7, 1992

[54] ELECTROSTATIC CHUCK USING A.C. FIELD EXCITATION

[75] Inventors: Christopher M. Horwitz, Summer Hill; Stephen Boronkay, Bondi, both of Australia

[73] Assignee: Unisearch Limited, Kensington, Australia

[21] Appl. No.: 449,831

[22] PCT Filed: May 5, 1988

[86] PCT No.: PCT/AU88/00133
§ 371 Date: Jan. 3, 1990
§ 102(e) Date: Jan. 3, 1990

[87] PCT Pub. No.: WO88/09054
PCT Pub. Date: Nov. 17, 1988

[30] Foreign Application Priority Data
May 6, 1987 [AU] Australia .................... PI1766

[51] Int. Cl.$^5$ ................................ H01F 13/00
[52] U.S. Cl. ........................ 361/234; 269/8; 269/903; 361/235; 361/145
[58] Field of Search ............ 361/230, 233, 234, 235, 361/145; 269/8, 903

[56] References Cited
U.S. PATENT DOCUMENTS

| | | | |
|---|---|---|---|
| 3,197,682 | 7/1965 | Klass et al. | 361/234 |
| 3,253,200 | 5/1966 | Klass et al. | 361/234 |
| 4,480,284 | 10/1984 | Tojo et al. | 361/234 |
| 4,502,094 | 2/1985 | Lewin et al. | 361/234 |
| 4,667,110 | 5/1987 | Kariya | 361/234 |
| 4,766,515 | 8/1988 | Bollen et al. | 361/234 |

OTHER PUBLICATIONS

Derwent Abstract Accession No. 83172 K/04 class 502. SU/A, 915192 (Gelikman) 23 Mar. 1982 (23.03.82).

*Primary Examiner*—A. D. Pellinen
*Assistant Examiner*—Jeffrey A. Gaffin
*Attorney, Agent, or Firm*—Morrison & Foerster

[57] ABSTRACT

An electrostatic chuck for semiconductor wafers (10) uses at least three electrodes (12, 13, 14). Two electrodes (13, 14) defining a substantially planar surface and embedded in a thin dielectric film (11), are respectively excited by a low-frequency A.C. supply (15, 16, 17, 18, 23) to produce sinewave fields of controlled amplitude and phase, provided a low resultant voltage on the wafer surface. A third electrode (12) acts as a shield electrode or as a reference point for the other two electrodes (13, 14). In addition, by controlled rates of voltage application and removal, low voltage gradients are obtained on the wafer (10); and no retentive forces exist in the dielectric medium (11). A low A.C. amplitude excitation of the chuck enables capacitive current sensing of the relative positions of the wafer (10) and the dielectric film (11), enabling simple control of voltage application to the two electrodes (13, 14).

17 Claims, 5 Drawing Sheets

ELECTROSTATIC CHUCK USING A.C. FIELD EXCITATION

The present invention relates generally to the field of materials handling and in particular the invention provides an improved electrostatic chuck for the holding of semiconductor wafers and other materials in operations such as vacuum sputter etching.

The semiconductor industry requires clamping and transport of crystalline wafers inside various processing machines. The wafers are intricately patterned on one face and can be damaged by contact on that face. In addition, contact on the wafer sides can result in chipping which not only could result in dirt particles on the patterned surface, but also in wafer breakage at a later time. Thus many rear-contact wafer transport methods have been developed (e.g., see P. H. Singer, "The Role of Wafer Transport in Front-End Automation", Semiconductor International, August 1983, pp. 60–65) but none of them allow motion of the wafer away from a horizontal plane due to their reliance on gravity and friction forces.

Applications which require wafer clamping in vacua, such as ion implantation or dry etching at high rates, have relied on mechanical clamps or electrostatic forces to counteract the cooling gas pressure applied at the wafer rear surface.

An example of a mechanical clamp is given in the U.S. Pat. No. 4,603,466 (M. J. Morley) where an outer ring presses down on the front face of a wafer, while the domed back surface is pressurised. However, wafer stress (though small) and possible damage to the wafer surface are occasioned by such prior art arrangements. In addition the clamping device of necessity obscures the outer ring which becomes useless for electronic device purposes.

Electrostatic attraction is in theory able to replace the above domed electrode shape with a flat one, and should also allow wafer retention without an outer mechanical clamping ring. Electrostatic chucks are described by G. A. Wardly, Reviews of Scientific Instruments Vol. 44, No. 10, October 1973 pp. 1506–1509; W. A. Eckes et al, U.S. Pat. No. 4,412,133; and in these chucks the electrostatic forces are used in addition to that of an outer mechanical clamping ring. A method of enhanced electrostatic attraction is described in U.S. Pat. No. 4,554,611 (I. H. Lewin) by utilising the charge retention, often observed in typical chuck insulating media, by mechanically jiggling the wafer then disconnecting the applied voltage. Wardly found that this dielectric retentive property decays at a rate related to atmospheric conditions, and employed a square-wave excitation voltage on his chuck to maintain long-term clamping action. Presumably the force described by Lewin decays according to Wardly's findings. Other electrostatic holding methods are described in U.S. Pat. Nos. 4,551,192 (V. Di Milia); 4,502,094 (I. H. Lewin et al); 4,480,284 (T. Tojo et al); and U.K. Patent Applications GB 2,050,064A (U. Berger); GB 2,149,697A (A. P. Neukermans et al).

These previous methods have in addition to the charge retention problem which makes both wafer retention and removal difficult, a need to directly contact the surface of the wafer in order to provide a voltage difference across the dielectric insulating layer. This direct contact, though advantageous in ensuring that the potential of the wafer surface is at a known fixed value, has the problems of wafer scratching mentioned earlier as well as of reliability in the contact itself. The U.S. Pat. No. 4,384,918 (N. Abe) overcomes this problem with application of a voltage between two rear electrodes; the wafer potential is intermediate and equal electrode areas result in nominally equal voltages and forces between each electrode and the wafer. The exact wafer potential is, however, not controlled.

Thus a need exists for an electrostatic transporting and chucking means which will indefinitely retain a wafer, if desired; release it quickly when required; and maintain a wafer at a known voltage level to prevent undesirable interactions with low-voltage plasma discharges. Another benefit of holding the wafer potential at known levels is that large voltage gradients are avoided when transferring the wafer from one holding device to another. Such voltage gradients may be sufficient to break down insulating layers on the wafer surface, resulting in electronic device destruction. A further object of this invention relates to the minimising of voltage gradients across a wafer surface, not only due to transfer between holding devices, but also due to the fields induced in the wafer by the electrostatic apparatus. If electric fields are to change with rapid rise- and fall-times, as described by Wardly and Eckes, clearly a chuck as described by Abe will induce large transient voltages across the wafer surface, again resulting in electronic device damage.

SUMMARY OF THE INVENTION

The present invention consists in an electrostatic chuck comprising three electrodes, upper surfaces of at least a first and second of said electrodes defining a substantially planar surface, a thin insulating, substrate supporting layer being disposed over the planar surface to define a substrate supporting surface, and the first and second electrodes being excited via respective excitation circuits by sinusoidal a.c. potentials while the third electrode acts as a shield electrode or as a reference point for the first and second electrodes.

In a preferred embodiment, the third electrode is a reference electrode and the remaining electrodes are excited relative to the reference electrode by separate a.c. potentials. These a.c. potentials will preferably be balanced to minimise the voltage gradients applied to the substrate held on the chuck.

In another form, the invention is configured as a transport paddle.

In a preferred embodiment of this invention, a simple means of sensing the proximity of the wafer and its holding means is provided, enabling accurate control of their relative positions prior to excitation of the electrostatic holding fields.

Finally in preferred embodiments of the invention, the shield ring or plate is held at a substantially similar potential to the wafer potential, which serves in an electrostatic chuck as an equipotential extension of the wafer and as an rf reference electrode. In an electrostatic wafer handler this shield serves as a ground reference electrode substantially at an equipotential with the wafer being carried as well as with other nearby objects, which would otherwise be attracted to the high-voltage electrodes.

Chuck construction is determined by it's intended use. For example in a radio-frequency etch apparatus high electric fields are required to obtain strong holding forces, and good radio-frequency power transfer through the chuck is also a requirement. In such a case the attracting electrodes may be thin conductive films sandwiched in between thin ceramic (e.g. sapphire, boron nitride) layers which are in turn supported on the r.f. reference electrode. Other implementations are also possible as shown in the following description.

BRIEF DESCRIPTION OF THE DRAWINGS

Embodiments of the invention will now be described by way of example with reference to the accompanying drawings in which:

Referring to FIG. 1, a schematic of an electrostatic holding device is illustrated in cross-section with its driving electronics.

Figure 1:
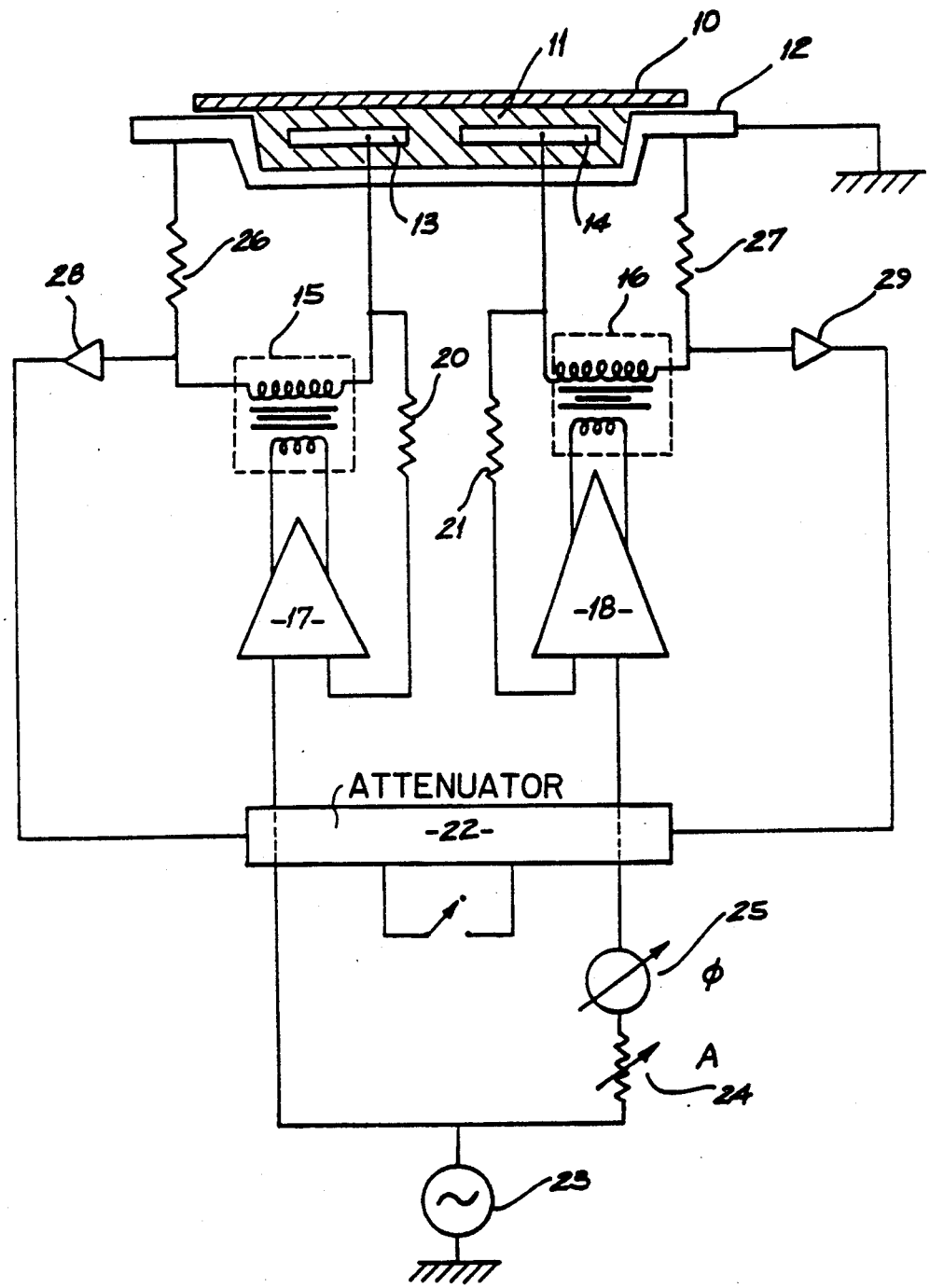
FIG. 1 schematically illustrates an embodiment of an electrostatic holding device according to the invention, with its associated driving electronics.

The wafer 10 sits on dielectric material 11 and overlies a shield plate or reference electrode 12 and is attracted electrostatically by electrodes 13, 14 which are driven from transformers 15, 16 and output drive amplifiers 17, 18. The feedback components 20, 21 ensure controlled amplitude, phase and distortion on the output signals. The amplifier input signals are derived through a switched attenuator 22 which ensures that the input signal rate of rise or fall is limited, as well as turning the signals on or off. The input signals are derived from a single oscillator 23 which typically operates at 200 Hz, although a low resistivity wafer substrate 10 would allow the use of higher frequencies without excessive voltage generation on the wafer surface. The relative phase and amplitude between the amplifier input signals is adjusted by controls 24, 25 to result in accurate nulling of the voltage induced on the surface of wafer 10 by the electrodes 13, 14. Ideally an equal area ratio and insulator thickness between electrodes 13, 14 and wafer 10 would allow zero wafer voltage with equal applied electrode voltage. However manufacturing tolerances and the high required voltages result in large typical error voltages on the wafer in practice, unless the relative phase and amplitude of the electrode voltages is not controlled. Current sense resistors 26, 27 monitor the electrode current and comparator amplifiers 28, 29 sense the proximity of wafer 10 to the dielectric surface 11 by an increase in current flow. The switched attenuator 22 must be set to allow only a small a.c. signal to the electrodes 13, 14 for this proximity sensing to work. When wafer 10 is sufficiently close, the attenuator 22 is disabled and causes large attraction voltages to be applied to the electrodes 13, 14.

Figure 2:
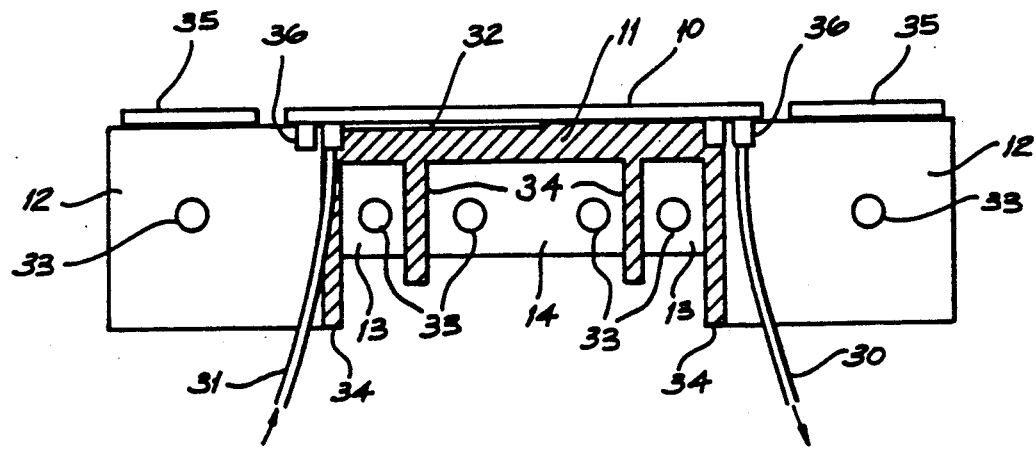
FIG. 2 is a sectional elevation of an embodiment of the invention adapted to heatsink a held wafer during vacuum processing.
Figure 3:
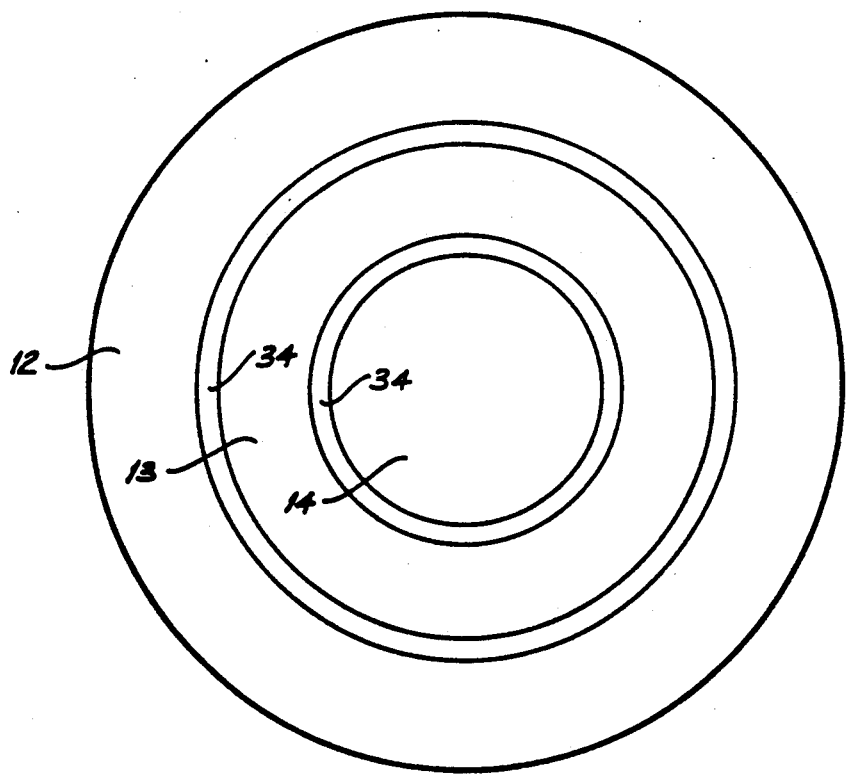
FIG. 3 is a plan view of the electrode configuration of the embodiment of FIG. 2.

Referring to FIG. 2, an implementation of this holding device is illustrated which is used to hold wafers and to heatsink these while performing vacuum processing, such as reactive sputter etching at a high radio frequency or d.c. potential. The electrode configuration of the chuck of FIG. 2 is shown in plan view in FIG. 3.

While the elements 11, 12, 13, 14 of the chuck of FIG. 2 operate in the same manner as described with reference to FIG. 1, they are connected to the circuitry of FIG. 1 through radio frequency chokes when used in a radio frequency environment, and the reference electrode 12 of FIG. 2 is allowed to float electrically at the d.c. potential reached by the assembly in the plasma discharge, whereas in FIG. 1 this electrode was grounded. Channel 30 connects to an annular ring under the periphery of wafer 10 and serves as a channel through which any gas which may leak from the rear of the wafer may be pumped out before reaching the vacuum system to which the front of the wafer is exposed. A small elastomeric seal 36 may be placed in this annular ring to aid sealing. Channel 31 connects to an annular ring inside that of channel 30 which is used to inject gas in between wafer 10 and dielectric 11 to aid in thermal transfer. This gas would optimally be hydrogen but helium is also a satisfactory heat transfer agent, and may be more compatible with the process gases being used to fabricate the wafer. Channel 31 also connects to channels 32 disposed in the dielectric 11 which serve to conduct the gas across the rear surface of wafer 10. Such channels must be of small total area otherwise the electrostatic forces would be reduced. In addition such channels must be shallow otherwise low-pressure plasma discharges will occur. An alternative to shallow channels 32 is lining of the channels with conductive material such as metal or carbon which also prevents discharges.

Water cooling channels 33 keep the electrodes 12, 13, 14 at a suitably low temperature, while rings of insulation 34 prevent high-voltage arcs between electrodes and the material 35 is chosen to be compatible with the processes chosen, e.g., pure aluminium or silicon may be chosen.

Figure 4:
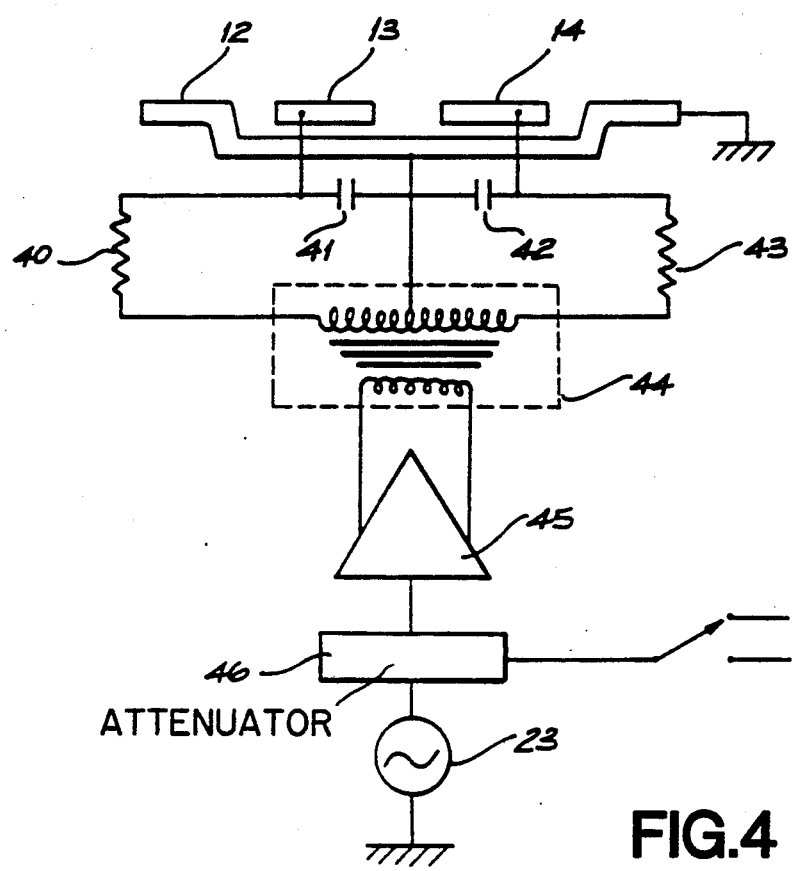
FIG. 4 schematically illustrates an alternative method of driving the electrodes of an electrostatic chuck with controlled relative amplitude and phase.

FIG. 4 shows an alternative method of driving the electrodes with controlled relative amplitude and phase. Electrodes 13, 14 are driven relative to electrode 12 through resistors 40, 43 and with capacitors 41, 42 in parallel to the electrodes' capacitance. In practice it may be found necessary to use either resistor 40 and capacitor 42, or alternatively resistor 43 and capacitor 41, in order to obtain a good signal match at the electrodes. These components are adjusted by hand which is more tedious than the method shown in FIG. 1, but is clearly simpler in construction and more economical. In addition better electrical isolation of electrode 12 from the system ground is possible, especially if feedback is not taken from the output winding. A single transformer 44 is fed by an amplifier 45 which is again fed through a soft-start, soft-stop circuit 46 (or switched attenuator) from oscillator 23.

Figure 5:
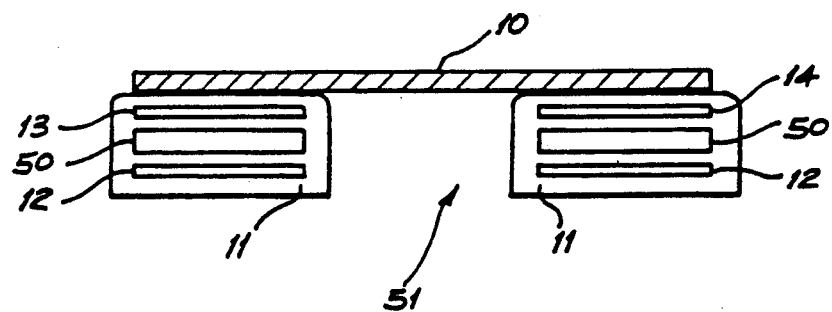
FIG. 5 is a sectional elevation of an electrostatic transport paddle.

FIG. 5 illustrates a wafer and wafer transport paddle wherein a wafer 10 is sitting on dielectric 11 and attracted by electrodes 13, 14. The shielding reference electrode 12 minimises stray attraction field leakage at the underside of the paddle and stiffening bars 50, typically made of a high-alumina ceramic, ensure paddle flatness under load. The optional gap 51 between the electrode assemblies is designed to allow the wafer to be accepted by an intermediate electrostatic chuck of small diameter for the purposes of wafer alignment or for lowering to the surface of a large chuck such as that shown in FIG. 2.

Figure 6:
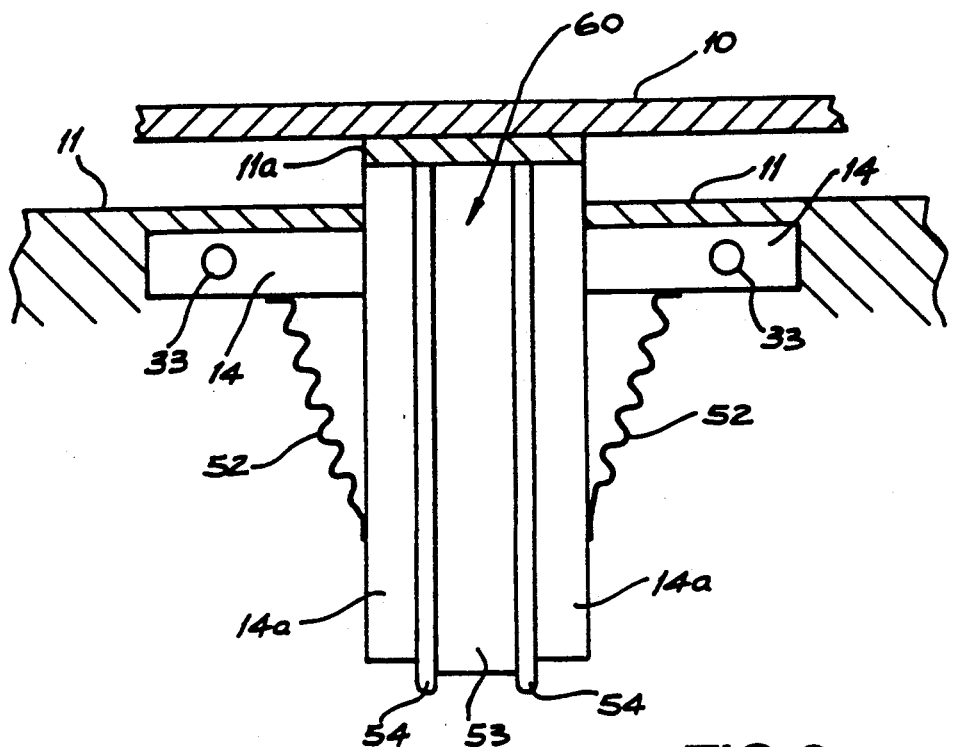
FIG. 6 is a sectional elevation of a further embodiment in which a central portion of the chuck of FIG. 2 is itself an independent electrostatic chuck which can be raised to facilitate removal of a wafer from the main chuck.
Figure 7:
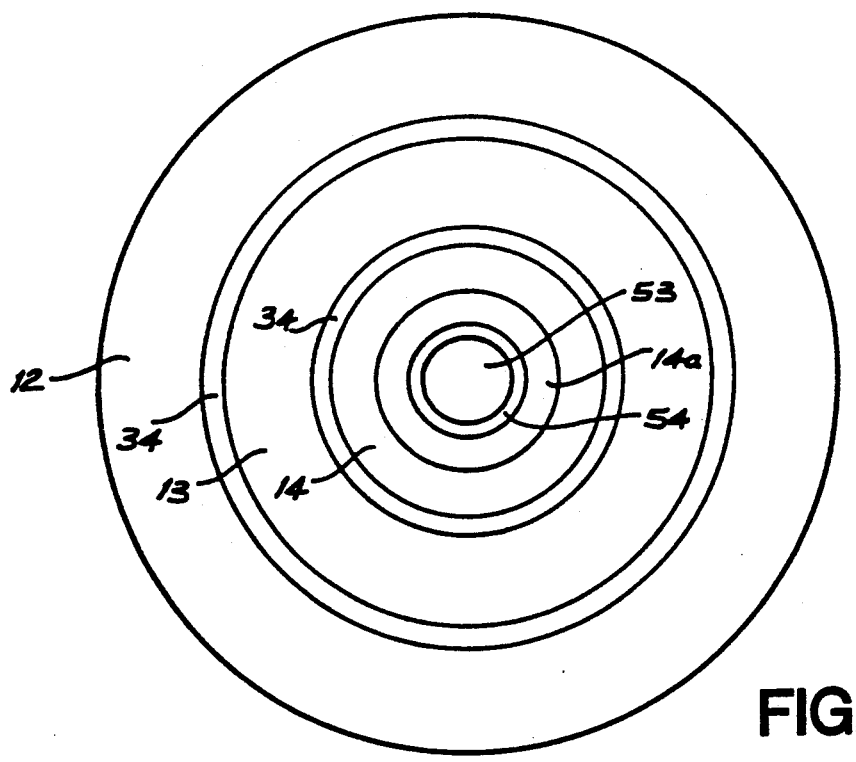
FIG. 7 is a plan view of the electrode configuration of the embodiment of FIG. 6.

An example of an intermediate chuck is illustrated in FIG. 6 wherein the intermediate chuck 60 is embedded in the centre of the chuck of FIG. 2 and is vacuum sealed by bellows 52 while being able to move up and down to respectively accept a wafer and then move it to the surface of the larger chuck. Electrode 53 is driven in similar fashion to electrode 13 with respect to electrode 14 and insulator 54 isolates these two electrodes. The electrode configuration of the chuck of FIG. 6 is shown in plan view in FIG. 7.

Figure 8:
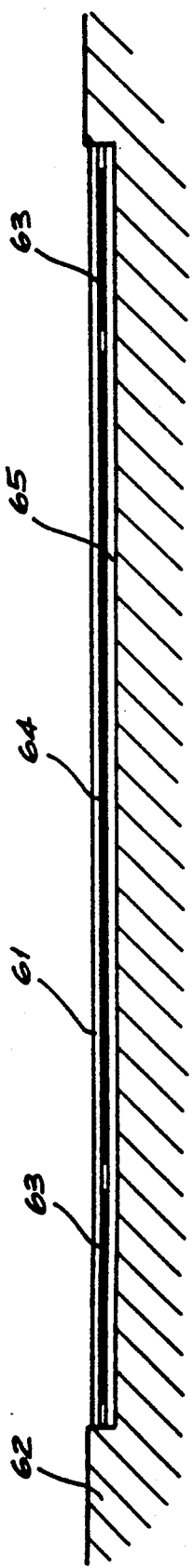
FIG. 8 is a sectional elevation through a further embodiment of the invention which employs thin film electrodes.

A preferred chuck construction for use in an r.f. sputter etching chamber is illustrated in FIG. 8 wherein the r.f. reference electrode 62 supports the remainder of the chuck structure. The two electrodes which are energized to activate the chuck are formed by placing respective thin film conductors 63 and 64 over a thin insulating layer 65 which may for example be formed as a thin ceramic layer such as sapphire ($Al_2O_3$). A further layer of thin insulating material 61 is then placed over the electrodes 63 and 64 to form the substrate supporting surface.

In the various embodiments of the invention, the presence of a substrate on the chuck can be detected by applying a low potential to the electrodes of the chuck and measuring the current flowing in the electrode energizing circuit. If the electrode current is within certain predefined limits, the full chuck energizing potential may be applied.

It will be recognised by persons skilled in the art that numerous variations and modifications may be made to the invention as described above without departing from the spirit or scope of the invention as broadly described.

We claim:

1. An electrostatic chuck for semiconductor wafers comprising:
    a first electrode having a planar upper surface,
    a second electrode having a planar upper surface said upper surfaces of said first and second electrodes being substantially in the same plane,
    and a third electrode,
    a first thin insulating layer disposed over said upper surfaces of said first and second electrodes for supporting a wafer substrate thereby defining a first substrate supporting surface;
    a first excitation circuit for exciting said first electrode with a sinusoidal a.c. potential,
    said first excitation circuit having a first a.c. signal output connected to said first electrode and a reference signal output connected to said third electrode;
    a second excitation circuit for exciting said second electrode with a sinusoidal a.c. potential,
    said second excitation circuit having a second a.c. signal output connected to said second electrode and a second reference signal output connected to said third electrode;
    said third electrode being a reference electrode to said first and second electrodes;
    said sinusoidal a.c. potentials of said first and said second electrodes being substantially balanced thereby minimizing a voltage gradient across the substrate wafer held by said chuck.

2. An electrostatic chuck as claimed in claim 1 further including balance control means for said first and second excitation circuits for balancing said first and second sinusoidal potentials to minimize voltage gradients in the substrate being held by said chuck.

3. An electrostatic chuck as claimed in claim 1 wherein said first thin insulating layer is a wafer of sapphire ($Al_2O_3$).

4. An electrostatic chuck as claimed in claim 1 wherein said first thin insulating layer is a wafer of Boron Nitride.

5. An electrostatic chuck as claimed in claim 1 wherein said first and second electrodes under said first thin insulating layer are thin conductive films supported on said third electrode and separated therefrom by a second thin insulating layer.

6. An electrostatic chuck as claimed in claim 1 wherein said first electrode is a circular electrode and said second electrode is an annular electrode concentric with said first electrode.

7. An electrostatic chuck as claimed in claim 6 wherein said third electrode is an annular electrode concentric with said first electrode and surrounding said second electrode, said third electrode having an upper surface substantially co-planar with the surface of said first thin insulating layer and acting as a shield ring providing an equipotential extension to a substrate held in said chuck and acting as an r.f. reference electrode when said chuck is used in a sputter etching chamber.

8. An electrostatic chuck as claimed in claim 1 further including means for measuring electric current flow to said first and second electrodes at a low electrode excitation amplitude to determine the presence or absence of a substrate which is to be held using large-signal excitation of the electrodes.

9. An electrostatic chuck as claimed in claim 1 wherein said first and second electrodes are driven via respective excitation circuits with opposite polarities such that the potentials on the electrodes are balanced about the reference potential of the third electrode, the two excitation circuits being driven by a signal from a common signal source.

10. An electrostatic chuck as claimed in claim 9 wherein said signal applied to one of said first and second excitation circuits from said signal source is fed via an amplitude and phase control means for balance adjustment between the potentials applied to said first and second electrodes.

11. An electrostatic chuck as claimed in claim 1 wherein a central portion of said first substrate supporting surface of the chuck is arranged to be projected and retracted vertically upwardly above the remainder of the substrate supporting surface to facilitate removal from and placement on the chuck of a substrate.

12. An electrostatic chuck as claimed in claim 11 wherein the central projectable portion of said chuck has fourth and fifth electrodes, respectively held at the same potential as any two of the first, second and third electrodes of the chuck, said fourth and fifth electrodes being covered with an insulating layer to form a second substrate supporting surface such that said second substrate supporting surface is co-planar with said first substrate supporting surface when said central portion is retracted.

13. A electrostatic chuck as claimed in claim 1, having said first and second electrodes located parallel to one another and separated by a predetermined gap, such that the arrangement may be placed about a narrow supporting surface to allow a substrate to be transferred between said supporting surface of the arrangement and said narrow supporting surface.

14. An electrostatic chuck as claimed in claim 1 wherein said third electrode is being connected to ground.

15. An electrostatic chuck for semiconductor wafers comprising:
    a first electrode having a planar upper surface,
    a second electrode having a planar upper surface said upper surfaces of said first and second electrodes being substantially in the same plane,
    and a third electrode,
    a first thin insulating layer disposed over said upper surfaces of said first and second electrodes for supporting a wafer substrate;
    an excitation circuit for exciting said first electrode with a first sinusoidal a.c. potential, and said second electrode with a second sinusoidal a.c. potential, said excitation circuit including an amplifier and a transformer with a center tapped output, providing said first sinusoidal signal and said second sinusoidal signal relative to the center tap of said output, said center tap being connected to said third electrode.
    said third electrode being a reference electrode to said first and second electrodes;
    said sinusoidal a.c. potentials of said first and said second electrodes being substantially balanced thereby minimizing a voltage gradient across the substrate wafer held by said chuck.

16. An electrostatic chuck as claimed in claim 15 wherein said excitation circuit further includes resistive and capacitive elements connected between said outputs of said transformer and said first and second electrodes for balancing said first and second sinusoidal signals.

17. An electrostatic chuck as claimed in claim 15 wherein said third electrode is being connected to ground.

* * * * *